US012764868B2

(12) United States Patent
Jeong et al.

(10) Patent No.: US 12,764,868 B2
(45) Date of Patent: Oct. 13, 2026

(54) PRINTED CIRCUIT BOARD

(71) Applicant: SAMSUNG ELECTRO-MECHANICS CO., LTD., Suwon-si (KR)

(72) Inventors: Soo Bin Jeong, Suwon-si (KR); Byung Kuk Kang, Suwon-si (KR); Woo Seok Yang, Suwon-si (KR); Hyuk Park, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 204 days.

(21) Appl. No.: 18/828,557

(22) Filed: Sep. 9, 2024

(65) Prior Publication Data

US 2025/0194017 A1 Jun. 12, 2025

(30) Foreign Application Priority Data

Dec. 11, 2023 (KR) ........................ 10-2023-0178390

(51) Int. Cl.

*H05K 1/00* (2006.01)
*H05K 1/11* (2006.01)
*H05K 1/183* (2026.01)

(52) U.S. Cl.

CPC ............. *H05K 1/183* (2013.01); *H05K 1/116* (2013.01)

(58) Field of Classification Search

CPC ........ H05K 1/115; H05K 1/185; H05K 1/111; H05K 3/4697; H05K 3/4644; H05K 1/0298; H05K 1/183; H05K 3/4602; H05K 2201/096; H05K 1/02; H05K 1/0366; H05K 1/113; H05K 1/181; H05K 1/186; H05K 1/116; H05K 1/18; H05K 3/3452; H05K 3/4007; H05K 3/4623; H05K 1/0296; H05K 3/3436; H05K 3/4682; H05K 2201/09472; H05K 2201/09909; H05K 2201/10674; H05K 2203/1469; H05K 3/0097; H05K 3/062; H05K 3/4614; H05K 1/03; H05K 1/036; H05K 1/184; H05K 2201/0141;

(Continued)

(56) References Cited

U.S. PATENT DOCUMENTS 10,199,337 B2 * 2/2019 Park .................... H10W 70/614
2004/0235220 A1 11/2004 Maeda (Continued)

FOREIGN PATENT DOCUMENTS

JP 2004-349440 A 12/2004

*Primary Examiner* — Pete T Lee
(74) *Attorney, Agent, or Firm* — Morgan, Lewis & Bockius LLP

(57) ABSTRACT

A printed circuit board includes an electronic component including a body, a plurality of metal pads disposed on the body to be spaced apart from each other, and a passivation layer covering a portion of each of the plurality of metal pads, and an insulating layer covering at least a portion of the electronic component. The passivation layer has a plurality of first openings exposing different portions of each of the plurality of metal pads, and a plurality of second openings spaced apart from the plurality of metal pads, the plurality of second openings respectively passing through at least a portion of the passivation layer. The insulating layer is disposed in at least a portion of each of the plurality of first and second openings.

25 Claims, 14 Drawing Sheets

(58) Field of Classification Search
CPC . H05K 2201/10159; H05K 2201/2081; H05K 2203/1536; H05K 3/108; H05K 3/244; H05K 3/429; H05K 1/0256; H05K 1/0271; H05K 1/0313; H05K 1/0373; H05K 1/09; H05K 2203/0191; H05K 2203/025; H05K 3/00; H05K 3/0044; H05K 3/025; H05K 3/107; H05K 3/284; H05K 3/382; H05K 3/4605; H05K 3/4661; H05K 1/0306; H05K 2201/09563; H05K 2201/09827; H05K 2201/099; H05K 2201/10295; H05K 2201/10689; H05K 2203/168; H05K 3/24; H05K 3/3465; H05K 3/4611; H05K 1/053; H05K 1/165; H05K 2201/0338; H05K 2201/0347; H05K 2201/08; H05K 2203/061; H05K 3/32; H05K 3/321; H05K 3/46; H05K 1/0218; H05K 1/0231; H05K 1/0243; H05K 1/038; H05K 1/05; H05K 1/145; H05K 1/189; H05K 2201/09481; H05K 2201/09609; H05K 2201/09618; H05K 2201/10015; H05K 2201/10106; H05K 2201/10515; H05K 2201/10522; H05K 2203/0207; H05K 2203/1383; H05K 2203/1388; H05K 3/0011; H05K 3/0017; H05K 3/0047; H05K 3/02; H05K 3/06; H05K 3/101; H05K 3/181; H05K 3/323; H05K 3/4069; H05K 3/4626; H05K 3/4691; H10W 70/685; H10W 70/614; H10W 90/701; H10W 70/65; H10W 70/05; H10W 72/30; H10W 74/15; H10W 70/68; H10W 72/019; H10W 72/20; H10W 72/90; H10W 70/60; H10W 72/9413; H10W 90/724; H10W 90/734; H10W 42/20; H10W 42/276; H10W 70/69; H10W 20/40; H10W 70/09; H10W 70/635; H10W 70/682; H10W 72/07338; H10W 72/07339; H10W 72/07352; H10W 72/252; H10W 72/321; H10W 72/325; H10W 72/353; H10W 72/354; H10W 72/884; H10W 72/931; H10W 74/117
See application file for complete search history.

(56) References Cited

U.S. PATENT DOCUMENTS

| | | | | |
|---|---|---|---|---|
| 2014/0070396 | A1* | 3/2014 | Kyozuka ............... | H10W 70/09 257/698 |
| 2017/0365566 | A1* | 12/2017 | Lee ........................ | H05K 1/185 |
| 2022/0115319 | A1 | 4/2022 | McKnight-Macneil | |

* cited by examiner

PRINTED CIRCUIT BOARD

CROSS-REFERENCE TO RELATED APPLICATION(S)

This application claims benefit of priority to Korean Patent Application No. 10-2023-0178390 filed on Dec. 11, 2023 in the Korean Intellectual Property Office, the disclosure of which is incorporated herein by reference in its entirety.

TECHNICAL FIELD

The present disclosure relates to a printed circuit board.

Recently, in order to improve electrical properties such as power integrity and achieve a high degree of integration, it has been required to embed an integrated passive device (IPD) in a printed circuit board. However, when the IPD is simply embedded in a board, various delamination phenomena may occur.

SUMMARY

An aspect of the present disclosure provides a printed circuit board capable of improving delamination that may occur when an electronic component such as an integrated passive device (IPD) is embedded.

According to an aspect of the present disclosure, an additional opening may be formed to expose a body of an electronic component, such as an IPD, to a passivation layer of the electronic component, before and/or after the electronic component is embedded in an insulating layer, such as an Ajinomoto build-up film (ABF), of a board.

For example, a printed circuit board according to an aspect of the present disclosure may include an electronic component including a body, a plurality of metal pads disposed on the body to be spaced apart from each other, and a passivation layer covering a portion of each of the plurality of metal pads, and an insulating layer covering at least a portion of the electronic component. The passivation layer may have a plurality of first openings exposing different portions of each of the plurality of metal pads, and a plurality of second openings spaced apart from the plurality of metal pads, the plurality of second openings respectively passing through at least a portion of the passivation layer. The insulating layer may be disposed in at least a portion of each of the plurality of first and second openings.

According to another aspect of the present disclosure, roughness may be formed on each of surfaces of a plurality of metal pads of an electronic component, before and/or after the electronic component is embedded in an insulating layer, such as an ABF, of a board.

For example, a printed circuit board according to another aspect of the present disclosure may include an IPD including a body, a plurality of copper pads disposed on the body to be spaced apart from each other, and a polyimide film having at least a portion disposed between two adjacent metal pads, among the plurality of copper pads, on the body, the polyimide film covering at least a portion of an upper surface and at least a portion of a side surface of one of the plurality of copper pads, and an ABF covering at least another portion of the upper surface of the one of the plurality of copper pads and at least a portion of the polyimide film. At least another portion of the upper surface of the one of the plurality of copper pads, covered by the ABF, may have a surface roughness greater than that of at least a portion of a lower surface of the one of the plurality of metal pads in contact with the body.

For example, a printed circuit board according to another aspect of the present disclosure may include an electronic component including a body, a metal pad disposed on the body, and a passivation layer covering a portion of the metal pad; an insulating layer covering at least a portion of the electronic component; a wiring layer disposed on the insulating layer; and a connection via disposed in the insulating layer to connect the wiring layer and the metal pad to each other. The passivation layer may have an opening exposing a portion of an upper surface of the metal pad. The portion of the upper surface of the metal pad, exposed by the passivation layer and being in contact with the insulating layer and the connection via, may have a surface roughness greater than that of a portion of a lower surface of the metal pad in contact with the body.

According to example embodiments of the present disclosure, a printed circuit board may improve delamination that may occur when an electronic component such as an IPD is embedded.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
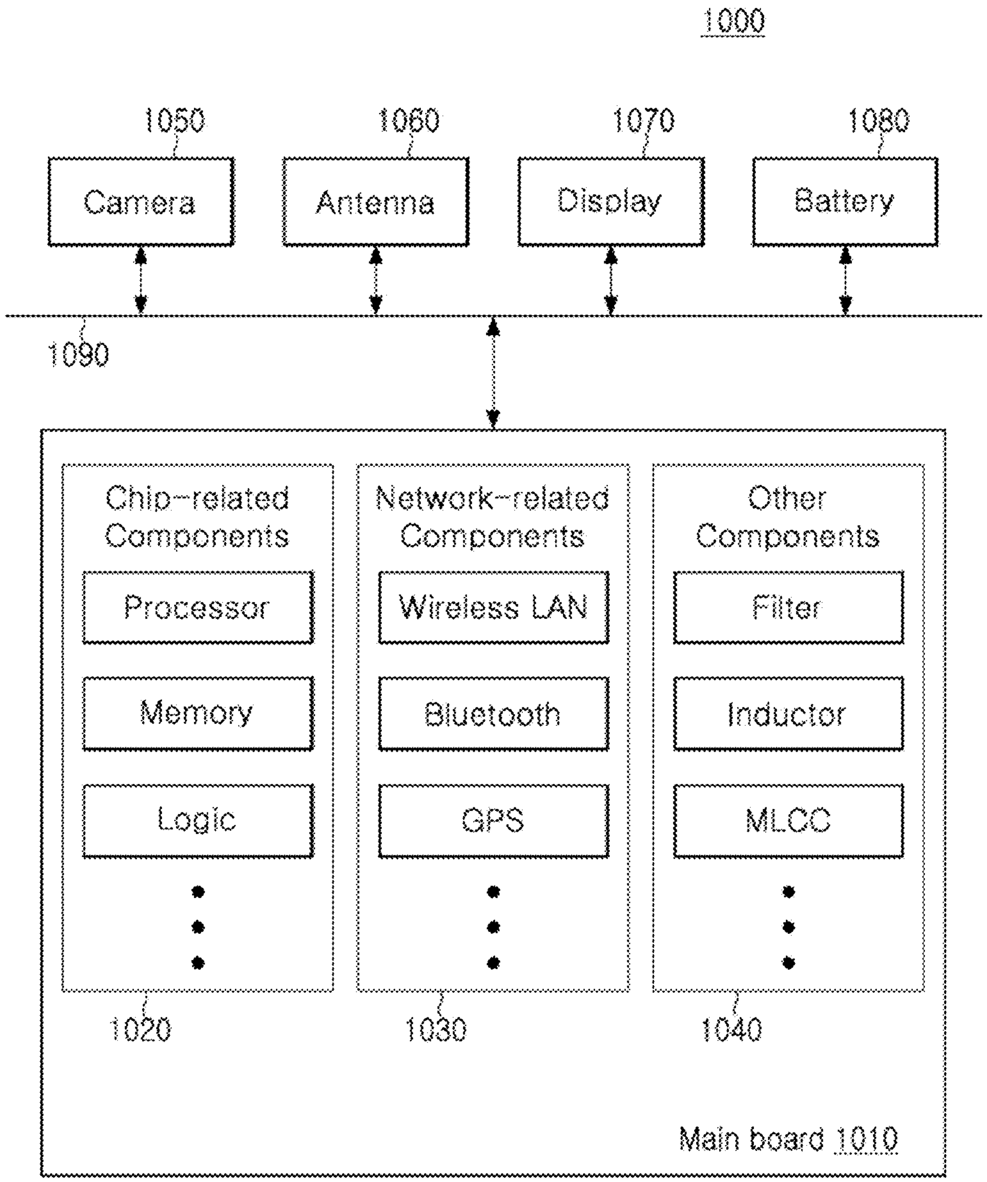
FIG. 1 is a schematic block diagram of an example of an electronic device system.

Hereinafter, example embodiments of the present disclosure are described with reference to the accompanying drawings. The shapes and sizes of components in the drawings may be exaggerated or reduced for clearer description.

Electronic Device

FIG. 1 is a schematic block diagram of an example of an electronic device system.

Referring to the drawing, an electronic device 1000 may accommodate a mainboard 1010. The mainboard 1010 may include chip-related components 1020, network-related components 1030, and other components 1040, physically or electrically connected thereto. Such components may be connected to other components to be described below to form various signal lines 1090.

The chip-related components 1020 may include a memory chip such as a volatile memory (for example, a dynamic random access memory (DRAM)), a non-volatile memory (for example, a read only memory (ROM)), or a flash memory, an application processor chip such as a central processor (for example, a central processing unit (CPU)), a graphics processor (for example, a graphics processing unit (GPU)), a digital signal processor, a cryptographic processor, a microprocessor, or a microcontroller, and a logic chip such as an analog-to-digital converter or an application-specific integrated circuit (ASIC). However, the chip-related components 1020 are not limited thereto, and may include other types of chip-related components. In addition, the chip-related components 1020 may be combined with each other. The chip-related components 1020 may be in the form of a package including the above-described chip or electronic component.

The network-related components 1030 may include protocols such as wireless fidelity (Wi-Fi) (Institute of Electrical And Electronics Engineers (IEEE) 802.11 family or the like), worldwide interoperability for microwave access (WiMAX) (IEEE 802.16 family or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the above-described protocols. However, the network-related components 1030 are not limited thereto, and may also include a variety of other wireless or wired standards or protocols. In addition, the network-related components 1030 may be combined with each other, together with the chip-related components 1020 described above.

The other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, the other components 1040 are not limited thereto, and may also include passive components used for various other purposes, or the like. In addition, the other components 1040 may be combined with each other, together with the chip-related components 1020 or the network-related components 1030 described above.

Depending on a type of the electronic device 1000, the electronic device 1000 may include other components that may be or may not be physically or electrically connected to the mainboard 1010. The other components may include, for example, a camera module 1050, an antenna module 1060, a display 1070, a battery 1080, and the like. However, the other components are not limited thereto, and may be an audio codec, a video codec, a power amplifier, a compass, an accelerometer, a gyroscope, a speaker, a mass storage unit (for example, a hard disk drive), a compact disk (CD), a digital versatile disk (DVD), or the like. In addition, the other components may also include other components used for various purposes depending on the type of electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device to process data.

Figure 2:
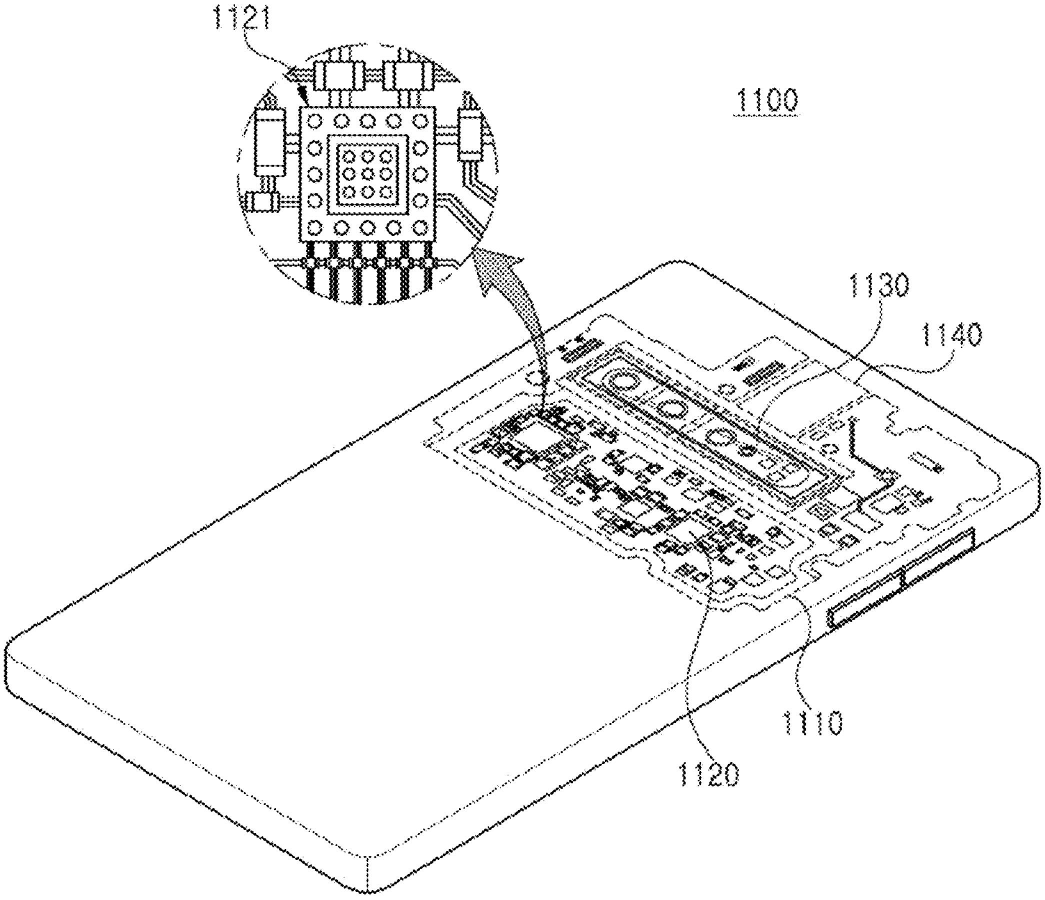
FIG. 2 is a schematic perspective view of an example of an electronic device.

FIG. 2 is a schematic perspective view of an example of an electronic device.

Referring to the drawing, an electronic device may be, for example, a smartphone 1100. The motherboard 1110 may be accommodated in the smartphone 1100, and various electronic components 1120 may be physically and/or electrically connected to the motherboard 1110. In addition, other electronic components that may be or may not be physically and/or electrically connected to the motherboard 1110 may be accommodated therein, such as a camera module 1130 and/or a speaker 1140. A portion of the electronic components 1120 may be the chip-related components described above, for example, a component package 1121, but the present disclosure is not limited thereto. The component package 1121 may be in the form of a printed circuit board on which electronic components including active components and/or passive components are surface-mounted. The electronic device is not necessarily limited to the smartphone 1100, and may be other electronic devices, as described above.

Printed Circuit Board

Figure 3:
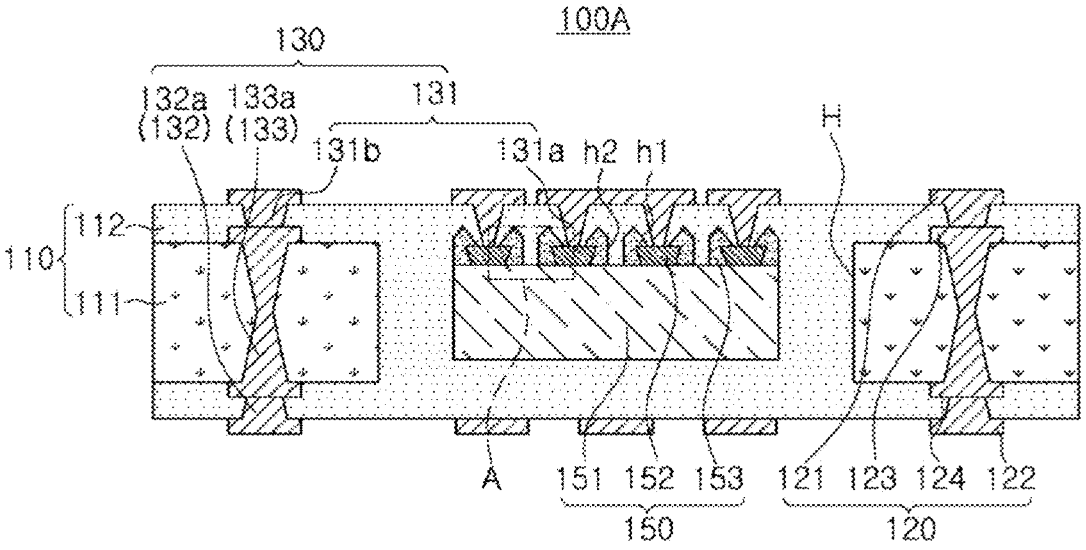
FIG. 3 is a schematic cross-sectional view of a printed circuit board according to an example.

FIG. 3 is a schematic cross-sectional view of a printed circuit board according to an example.

Figure 4A:
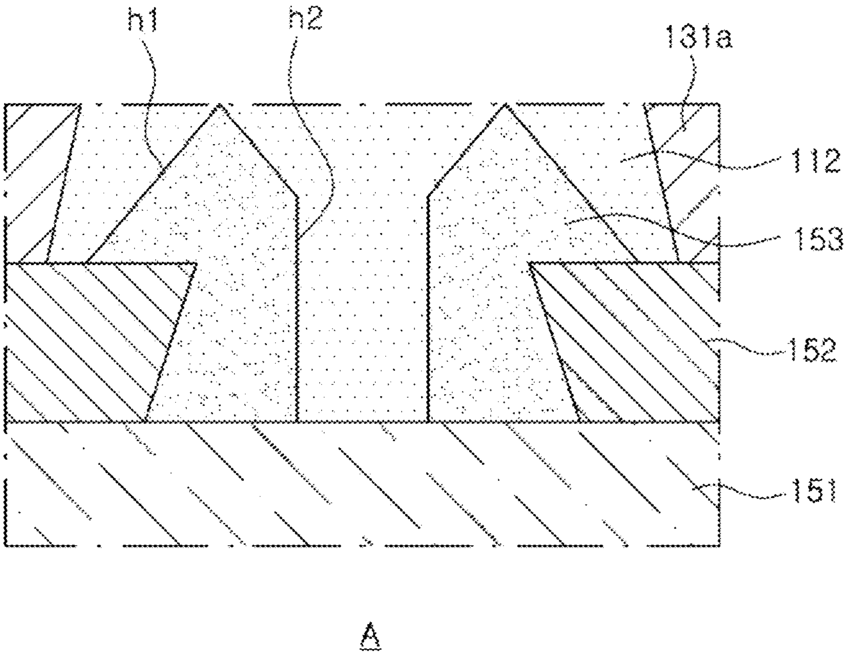
FIGS. 4A to 4C are schematic enlarged cross-sectional views of various examples of region A of the printed circuit board of FIG. 3.
Figure 4B:
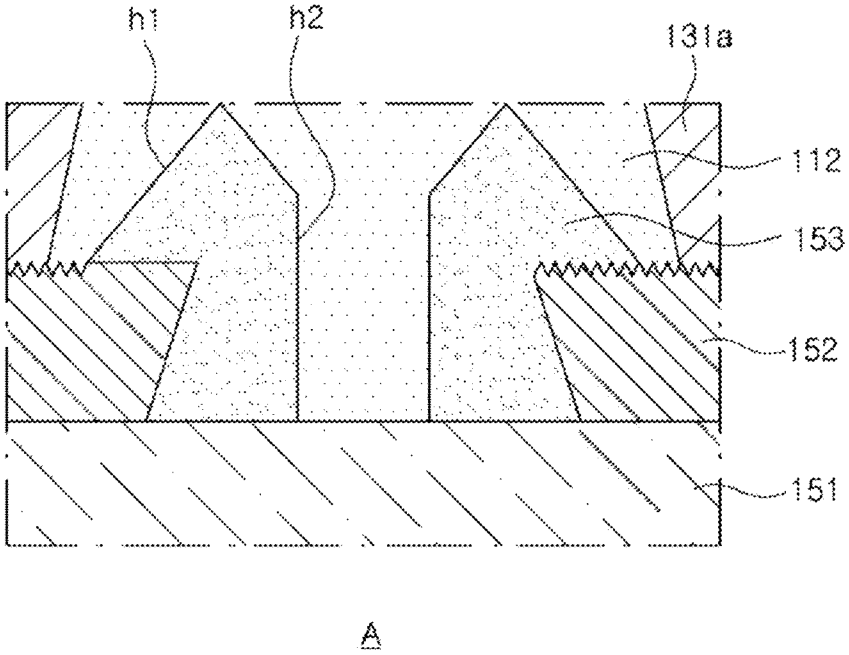
Figure 4C:
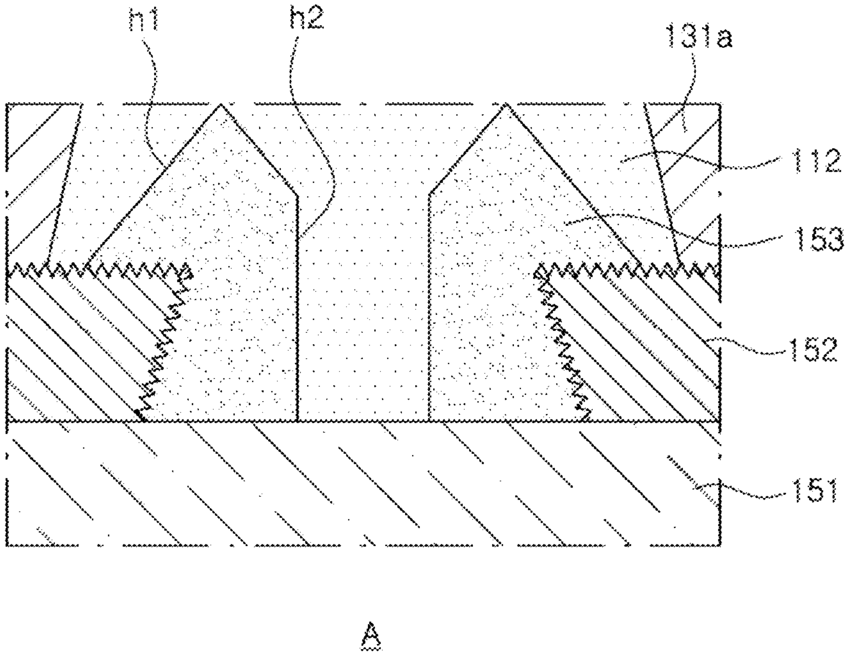

FIGS. 4A to 4C are schematic enlarged cross-sectional views of various examples of region A of the printed circuit board of FIG. 3.

Referring to the drawings, a printed circuit board 100A according to an example may include an insulating layer 110, a wiring layer 120 disposed on or in the insulating layer 110, a via layer 130 disposed in the insulating layer 110, and an electronic component 150 disposed in the insulating layer 110. For example, the printed circuit board 100A may have a board structure in which the electronic component 150 is embedded. The electronic component 150 may include a body 151, a plurality of metal pads 152 disposed on the body 151 to be spaced apart from each other, and a passivation layer 153 covering a portion of each of the plurality of metal pads 152. The passivation layer 153 may have a plurality of first openings h1 exposing a portion of each of the plurality of metal pads 152 from the passivation layer 153, and a plurality of second openings h2 spaced apart from the plurality of metal pads 152, the plurality of second openings h2 respectively passing through at least a portion of the passivation layer 153. The plurality of second openings h2 may respectively pass through at least a portion of the passivation layer 153, between two adjacent metal pads 152, among the plurality of metal pads 152. For example, the plurality of second openings h2 may respectively pass through the passivation layer 153 until a portion of the body 151 is exposed from the passivation layer 153. The plurality of second openings h2 may respectively have various forms, such as a trench, a hole, and the like, on a plane. At least two second openings h2, among the plurality of second openings h2, may be connected to each other. The insulating layer 110 may fill at least a portion of each of the first and second openings h1 and h2.

The market for large-area, high-specification server package boards has recently been expanding. In relation thereto, embedding an integrated passive device (IPD) in a board may be considered to manufacture a differentiated high-performance board having improved power integrity properties through reduced impedance. However, a surface of a copper pad of the IPD generally may not have roughness.

Accordingly, when a process using a liquid chemical is performed while a board is manufactured, liquid may permeate through a via formed on the IPD. In addition, a crevice may be formed more severely at a bottom portion of the via. As a result, a lifting phenomenon may occur at an interface between the copper pad of the IPD and an insulating layer of the board, an interface between the copper pad of the IPD and a polyimide film protecting the same, an interface of an edge region of the polyimide film, and the like. Conversely, the printed circuit board 100A according to an example may form a plurality of second openings h2 in the passivation layer 153 disposed on the body 151 of the electronic component 150, and the insulating layer 110 may fill at least a portion of each of the plurality of second openings h2. In this case, adhesion between the plurality of metal pads 152 and the insulating layer 110 and/or between the plurality of metal pads 152 and the passivation layer 153 may be improved by the insulating layer 110 filling the plurality of second openings h2. Accordingly, even when, for example, an IPD, including a plurality of copper pads and a polyimide film protecting the same, is embedded in the electronic component 150, the above-described delamination issue or the like may be improved. As a result, the printed circuit board 100A according to an example and a product including the same may have improved reliability.

The passivation layer 153 may cover an edge portion of an upper surface and a side surface of each metal pad 152, between two adjacent metal pads 152, among the plurality of metal pads 152. In this case, roughness may be formed on surfaces of the plurality of metal pads 152, as necessary. For example, as illustrated in FIG. 4B, a portion of an upper surface of each of the plurality of metal pads 152, exposed from the passivation layer 153, may have a surface roughness greater than that of a lower surface of each of the plurality of metal pads 152 in contact with the body 151. For example, as illustrated in FIG. 4C, at least a portion of an upper surface and at least a portion of a side surface of each of the plurality of metal pads 152, covered by the passivation layer 153, may have a surface roughness greater than that of a lower surface of each of the plurality of metal pads 152 in contact with the body 151. In this case, adhesion between the plurality of metal pads 152 and the insulating layer 110 and/or between the plurality of metal pads 152 and/or the passivation layer 153 may be further improved due to an increase in surface areas of the plurality of metal pads 152. Accordingly, even when, for example, an IPD, including a plurality of copper pads and a polyimide film protecting the same, is embedded in the electronic component 150, the above-described delamination issue or the like may be more effectively improved. As a result, the printed circuit board 100A according to an example and a product including the same may have improved reliability. Surface roughness may be formed when the electronic component 150 is manufactured, for example, when a single IPD is manufactured, but the present disclosure is not limited thereto. For example, the surface roughness illustrated in FIG. 4B may be formed during an embedding process, as will be described below.

The printed circuit board 100A according to an example may be applied as at least a portion of a multilayer circuit board. For example, the printed circuit board 100A may be applied to a central portion of the multilayer circuit board. In this case, a build-up process may be further performed on one or both sides of the printed circuit board 100A. The multilayer circuit board may be used as a flip-chip board (FCB), a ball grid array (BGA), an interposer board, a package board, or the like, but the present disclosure is not limited thereto, and may be applied to various other types of boards.

Hereinafter, components of the printed circuit board 100A according to an example will be described in more detail with reference to the drawings.

The insulating layer 110 may include a first insulating layer 111 having a through-portion H in which at least a portion of the electronic component 150 is disposed, and a second insulating layer 112 covering at least a portion of each of the first insulating layer 111 and the electronic component 150, the second insulating layer 112 filling at least a portion of the through-portion H. The first insulating layer 111 may be a core layer, and the second insulating layer 112 may be a build-up layer, but the present disclosure is not limited thereto. Each of the first and second insulating layers 111 and 112 may be formed of a plurality of insulating layers. The through-portion H may pass through a space between an upper surface and a lower surface of the first insulating layer 111, and may pass through only a portion of the first insulating layer 111 from the upper surface, as necessary. For example, the through-portion H may be a through-cavity or a blind cavity. A build-up insulating layer may be further disposed on the second insulating layer 112. The first and second insulating layers 111 and 112 may include an inorganic insulating material and/or an organic insulating material. As a non-limited example, both the first and second insulating layers 111 and 112 may include an organic insulating material. Alternatively, the first insulating layer 111 may include an inorganic insulating material, and the second insulating layer 112 may include an organic insulating material. However, the present disclosure is not limited thereto. The organic insulating material may include a thermosetting resin such as an epoxy resin, a thermoplastic resin such as polyimide, or an inorganic filler, an organic filler, and/or a glass fiber together with the resin. For example, the organic insulating material may be a copper clad laminate (CCL), a prepreg (PPG), an ABF, a photoimageable dielectric (PID) or the like, but the present disclosure is not limited thereto. The inorganic insulating material may include a glass board, a silicon board, and/or a ceramic board. For example, the glass board may include glass. Glass may include, for example, pure silicon dioxide (about 100% $SiO_2$), soda lime glass, borosilicate glass, alumino-silicate glass, or the like. However, the present disclosure is not limited thereto, and an alternative glass material, such as fluorine glass, phosphate glass, chalcogen glass, or the like, may also be used as a material of a glass layer. In addition, other additives may be further included to form glass having specific physical properties. The above-described additives may magnesium, calcium, manganese, aluminum, lead, boron, iron, chromium, potassium, sulfur, and antimony, as well as calcium carbonate (for example, lime) and sodium carbonate (for example, soda), and a carbonate and/or an oxide of the above-described elements and other elements. Glass may be distinguished from a glass fiber (glass cloth and/or glass fabric) included in the organic insulating material. In addition, the silicon board may include silicon (Si), and may include an oxide layer formed on silicon (Si), as necessary. In addition, the silicon board may include a nitride layer formed on the oxide layer. The oxide layer may include a silicon oxide film, and the nitride layer may include a silicon nitride film, but the present disclosure is not limited thereto. In addition, the ceramic board may include ceramic, and ceramic may include, for example, alumina ($Al_2O_3$), aluminum nitride (AlN), silicon carbide (SiC), silicon nitride ($Si_3N_4$), or the like, but the present disclosure is not limited thereto.

The wiring layer 120 may include a first wiring layer 121 disposed on an upper surface of the second insulating layer 112, a second wiring layer 122 disposed on a lower surface of the second insulating layer 112, a third wiring layer 123 disposed on an upper surface of the first insulating layer 111, the third wiring layer 123 at least partially buried in the second insulating layer 111, and a fourth wiring layer 124 disposed on a lower surface of the first insulating layer 111, the fourth wiring layer 124 at least partially buried in the second insulating layer 112. When the insulating layer 110 further includes a build-up insulating layer, the wiring layer 120 may also further include a build-up wiring layer. The first to fourth wiring layers 121, 122, 123, and 124 may include a metal, respectively. The metal may include copper (Cu), aluminum (Al), silver (Ag), tin (Sn), gold (Sn), nickel (Ni), lead (Pb), titanium (Ti), and/or alloys thereof. The metal may preferably copper (Cu), but the present disclosure is not limited thereto. The first to fourth wiring layers 121, 122, 123, and 124 may respectively perform various functions according to a design thereof. For example, a signal pattern, a power pattern, a ground pattern, and the like may be included. The patterns may respectively have various forms such as a line, a plane, a pad, and the like. The first to fourth wiring layers 121, 122, 123, and 124 may respectively include a seed layer and a plating layer formed on the seed layer. The seed layer may be an electroless plating layer (or chemical copper) and/or a sputtering layer, and the plating layer may be an electrolytic plating layer (or electrolytic copper), but the present disclosure is not limited thereto.

The via layer 130 may include a first via layer 131 including a plurality of first connection vias 131*a* respectively passing through a portion of the second insulating layer 112, the plurality of first connection vias 131*a* respectively connecting each of the plurality of metal pads 152 to at least a portion of the first wiring layer 121, and a plurality of second connection vias 131*b* respectively passing through another portion of the second insulating layer 112, the plurality of second connection vias 131*b* respectively connecting at least a portion of the first wiring layer 121 and at least a portion of the third wiring layer 123 to each other, a second via layer 132 including a plurality of third connection vias 132*a* respectively passing through another portion of the second insulating layer 112, the plurality of third connection vias 132*a* connecting at least a portion of the second wiring layer 122 and at least a portion of the fourth wiring layer 124 to each other, and a third via layer 133 including a plurality of through-vias 133*a* respectively passing through the first insulating layer 111, the plurality of through-vias 133*a* respectively connecting at least a portion of the third wiring layer 123 and at least a portion of the fourth wiring layer 124 to each other. When the insulating layer 110 further includes a build-up insulating layer, the via layer 130 may also further include a build-up via layer. The first to third via layers 131, 132, and 133 may respectively include a metal. The metal may include copper (Cu), aluminum (Al), silver (Ag), tin (Sn), gold (Au), nickel (Ni), lead (Pb), titanium (Ti), and/or alloys thereof. The metal may preferably copper (Cu), but the present disclosure is not limited thereto. The first to third via layers 131, 132, and 133 may respectively include a filled via filling a via hole or a through-hole, but may include a conformal via disposed along a wall surface of the via hole or the through-hole. The first to third via layers 131, 132, and 133 may perform various functions according to a design thereof. For example, a ground via, a power via, a signal via, or the like may be included. The first to third via layers 131, 132, and 133 may respectively include an electroless plating layer (or chemical copper) and an electrolytic plating layer (or electrolytic copper). A sputtering layer may be formed instead of the electroless plating layer (or chemical copper), and both may be included. The plurality of first and second connection vias 131*a* and 131*b* may have a tapered shape having an upper end having a width, greater than that of a lower end in cross-section. Each of the plurality of third connection vias 132*a* may have a tapered shape having a lower end having a width, greater than that of an upper end in cross-section. The plurality of through-vias 133*a* may have a substantially vertical side surface in cross-section, and may have a pillar shape such as a cylinder, an elliptical pillar, and a rectangular pillar, but the present disclosure is not limited thereto. A plugging material may be disposed in each of the plurality of through-vias 133*a*, and the plugging material may include an insulating material or a conductive material.

The electronic component 150 may include an active component and/or a passive component. The electronic component 150 may be a chip component, and may include, for example, an integrated circuit (IC) in which hundreds to millions of devices are integrated in a single chip. For example, the electronic component 150 may be formed based on an active wafer. In this case, silicon (Si), germanium (Ge), gallium arsenide (GaAs), or the like may be used as a base material included in the body 151. Various circuits may be formed in the body 151. A plurality of metal pads 152 may be formed on the body 151, and the plurality of metal pads 152 may respectively include a conductive material such as aluminum (Al), copper (Cu), or the like. For example, the plurality of metal pads 152 may respectively include a copper pad. A passivation layer 153, protecting the plurality of metal pads 152, may be formed on the body 151, and the passivation layer 153 may include an organic insulating film and/or an inorganic insulating film. For example, the passivation layer 153 may include a polyimide film. The passivation layer 153 may have a plurality of first openings h1, respectively exposing the plurality of metal pads 152, and a plurality of second openings h2, respectively exposing the body 151. The electronic component 150 may be preferably an IPD, for example, but the present disclosure is not limited thereto.

FIGS. 5A to 5G are schematic cross-sectional views of an example of manufacturing the printed circuit board of FIG. 3.

Figure 5A:
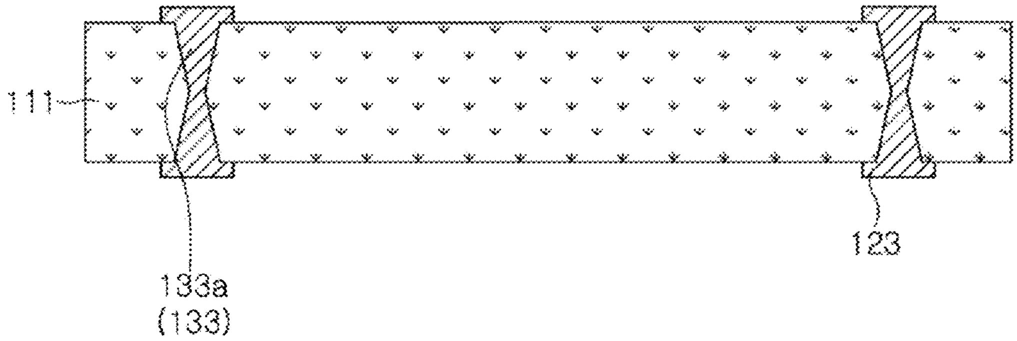
FIGS. 5A to 5G are schematic cross-sectional views of an example of manufacturing the printed circuit board of FIG. 3.

Referring to FIG. 5A, a first insulating layer 111 may be prepared. The first insulating layer 111 may be a CCL, but the present disclosure is not limited thereto. Subsequently, a through-hole may be formed in the first insulating layer 111 using a method such as mechanical drilling, laser drilling, a chemical etching, or the like. Subsequently, third and fourth wiring layers 123 and 124 and a third via layer 133 may be formed in the first insulating layer 111 using a plating process.

Figure 5B:
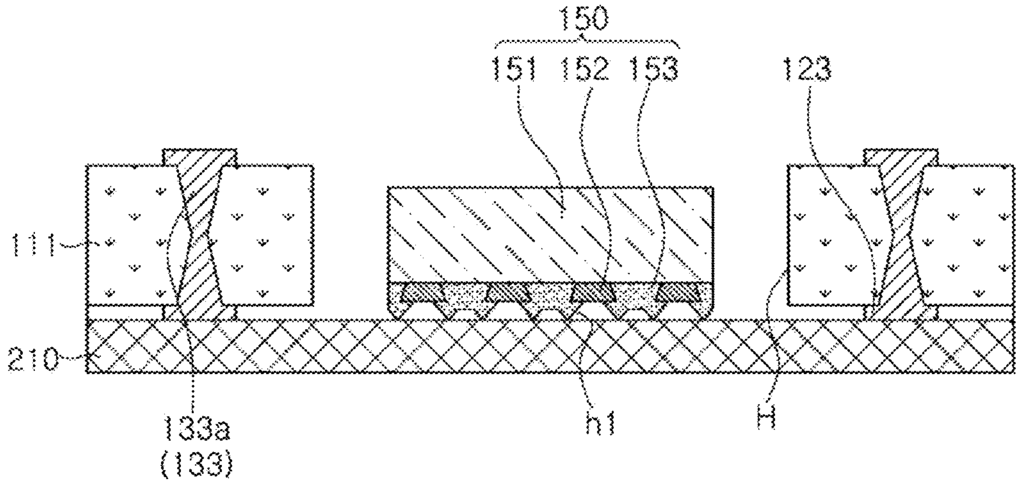

Referring to FIG. 5B, a through-portion H may be formed in the first insulating layer 111 by a method such as mechanical drilling, laser drilling, a chemical etching, or the like. Subsequently, a tape 210 may be attached to a lower side of the first insulating layer 111. For example, the fourth wiring layer 124 may be attached to the tape 210. The tape 210 may include an adhesive including an epoxy resin, but the present disclosure is not limited thereto. Subsequently, an electronic component 150, for example, an IPD, may be disposed in a face-down form in the through-portion H of the first insulating layer 111, using the tape 210. For example, a plurality of metal pads 152 may be attached to the tape 210.

Figure 5C:
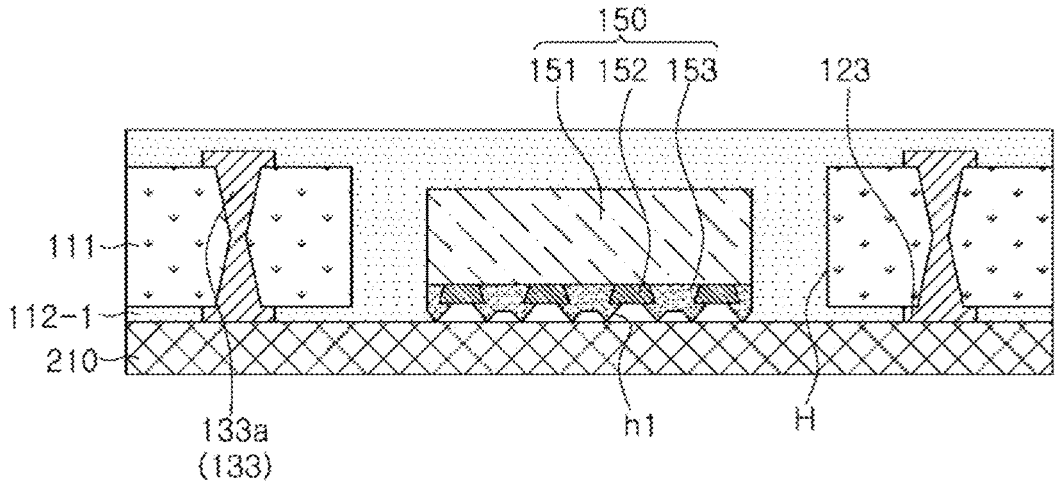

Referring to FIG. 5C, a second-first insulating layer 112-1, covering the first insulating layer 111 and the electronic component 150, may be formed. The second-first insulating layer 112-1 may be formed by laminating an insulating material such as an ABF. The second-first insulating layer 112-1 may fill at least a portion of the through-portion H. The second-first insulating layer 112-1 may be in a mid-cured state.

Figure 5D:
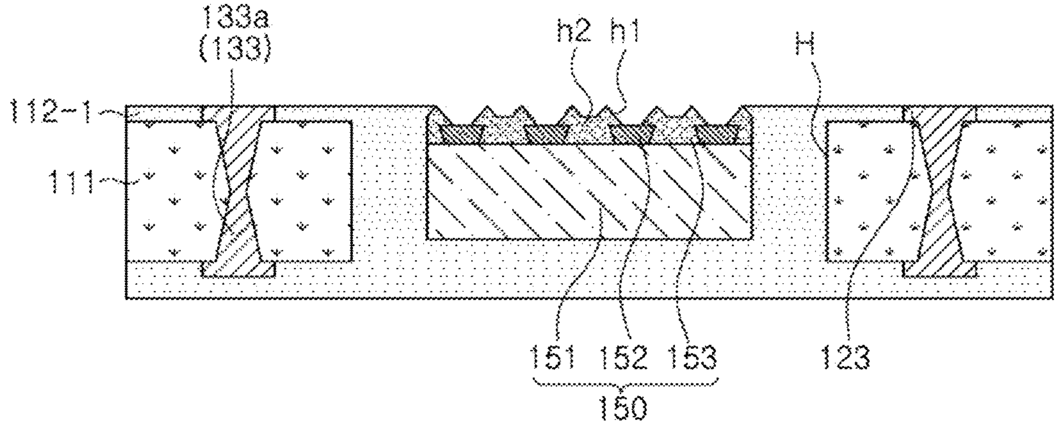

Referring to FIG. 5D, the tape 210 may be removed. The tape 210 may be removed using a physical method. The tape 210 may be removed using a chemical method, as necessary. When the tape 210 is removed, a plurality of metal pads 152 and a passivation layer 153 of the electronic component 150 may be exposed from the second-first insulating layer 112-1.

Figure 5E:
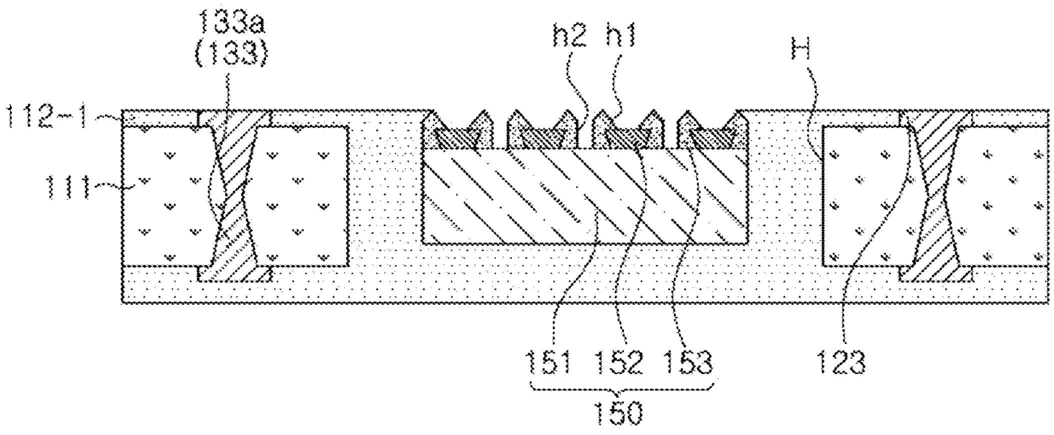

Referring to FIG. 5E, a plurality of second openings h2 may be formed in the exposed passivation layer 153 using laser drilling, chemical etching, or the like. Roughness may be formed on surfaces of the plurality of exposed metal pads 152 using surface treatment, as necessary. In this case, a delamination issue may be improved, as described above, due to an increase in surface area.

Figure 5F:
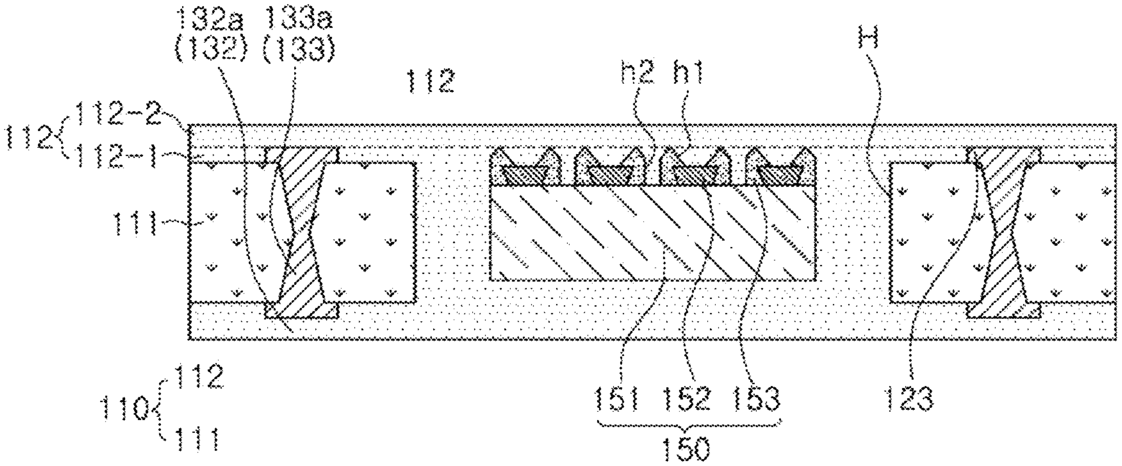

Referring to FIG. 5F, a second-second insulating layer 112-2, covering the first insulating layer 111 and the electronic component 150, may be formed. The second-second insulating layer 112-2 may be formed by laminating an insulating material such as an ABF in an opposite direction to the second-first insulating layer 112-1. The second-second insulating layer 112-2 may cover the exposed passivation layer 153 and the plurality of exposed metal pads 152. For example, a second-second insulating layer 112-2 may fill at least a portion of each of a plurality of first and second openings h1 and h2. After lamination, the second-first and second-second insulating layers 112-1 and 112-2 may be in a cured state, and may be integrated with each other, such that boundaries therebetween may not be apparent. For example, a second insulating layer 112 may be formed.

Figure 5G:
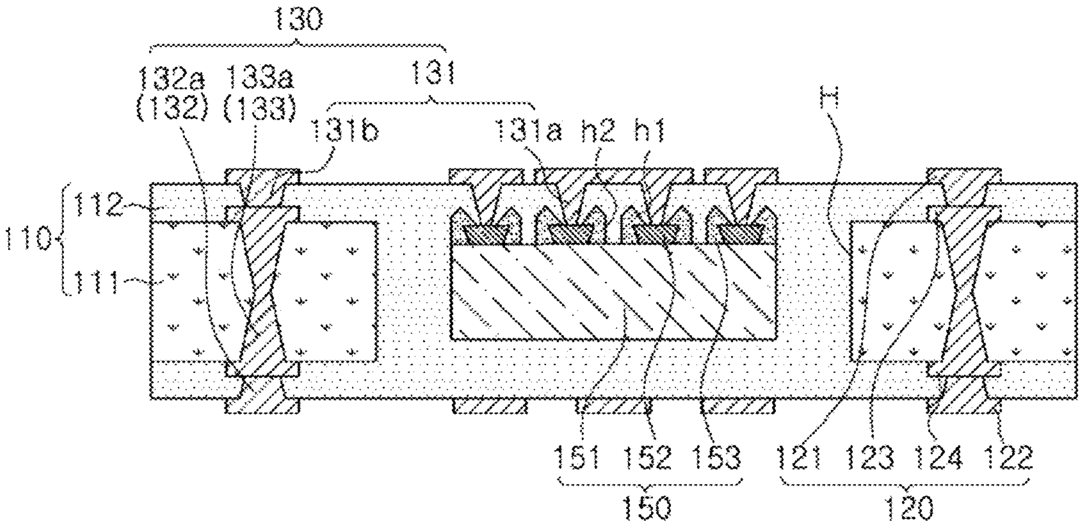

Referring to FIG. 5G, a via hole may be processed in the second insulating layer 112 using a method such as mechanical drilling, laser drilling, chemical etching, or the like, and a plating process may be performed to form first and second wiring layers 121 and 122 and first and second via layers 131 and 132.

The printed circuit board 100A according to an example may be manufactured using a series of processes, and other contents may be substantially the same as those described in connection with the printed circuit board 100A according to an example, and thus repeated descriptions will be omitted.

Figure 6:
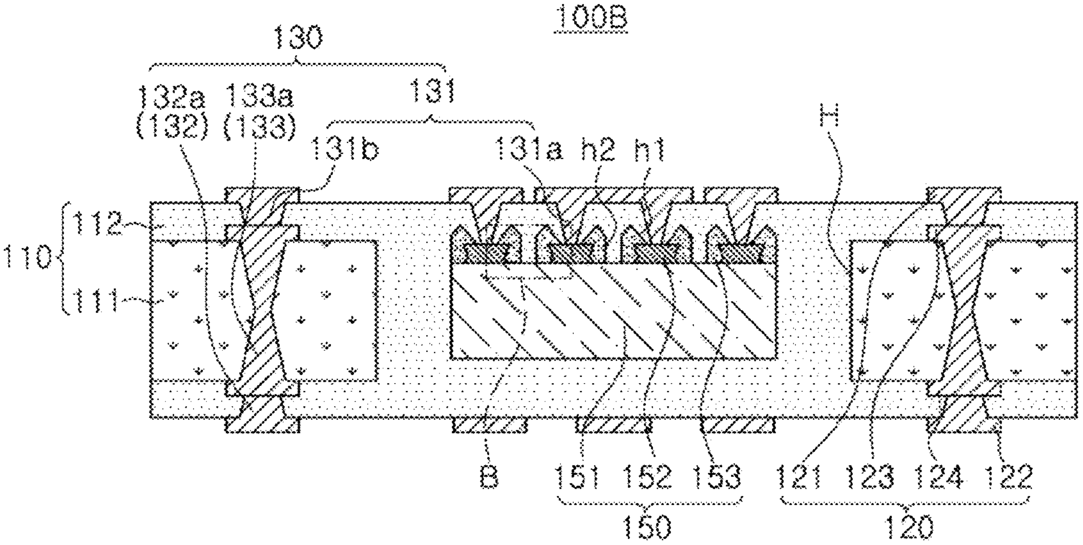
FIG. 6 is a schematic cross-sectional view of a printed circuit board according to another example.

FIG. 6 is a schematic cross-sectional view of a printed circuit board according to another example.

Figure 7A:
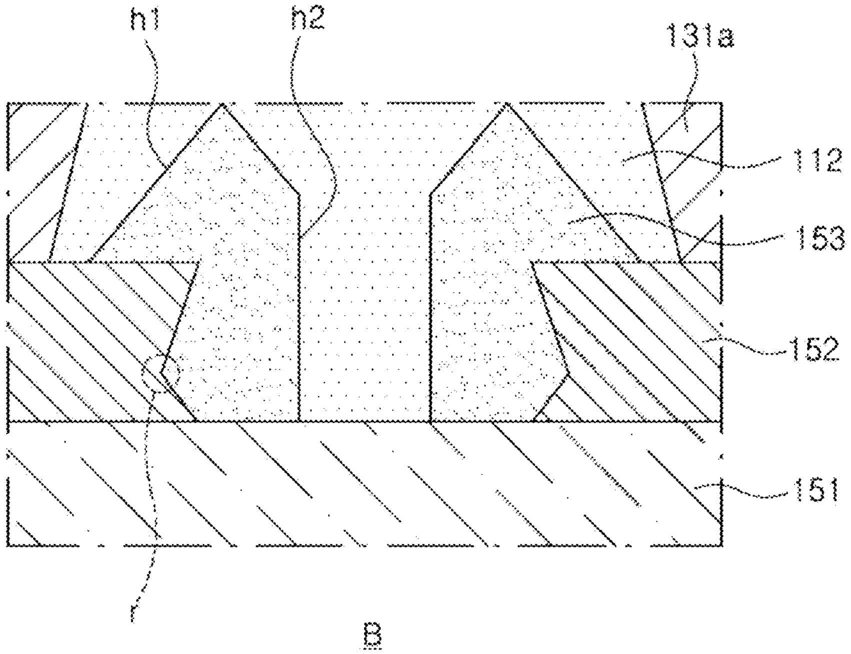
FIGS. 7A to 7C are schematic enlarged cross-sectional views of various examples of region B of the printed circuit board of FIG. 6.
Figure 7B:
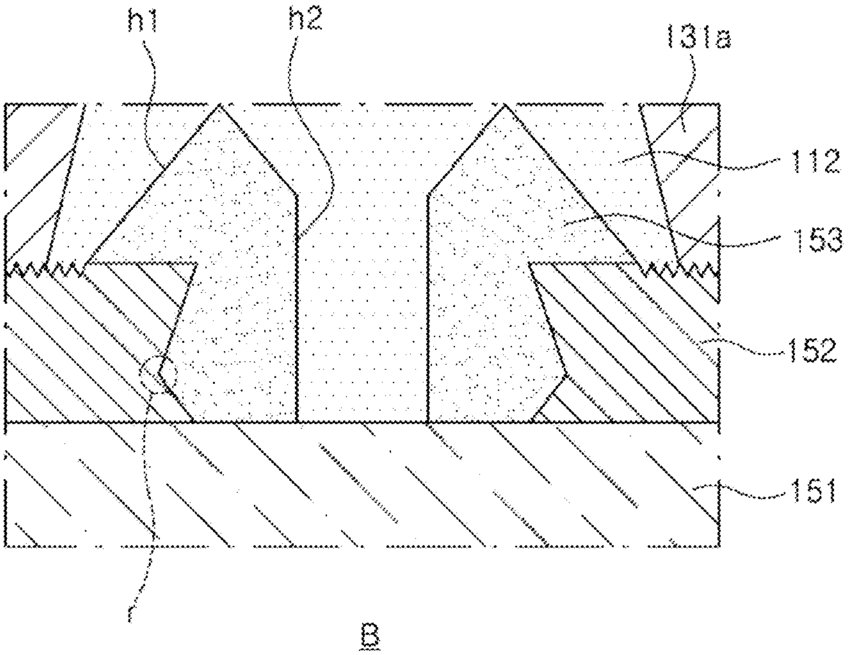
Figure 7C:
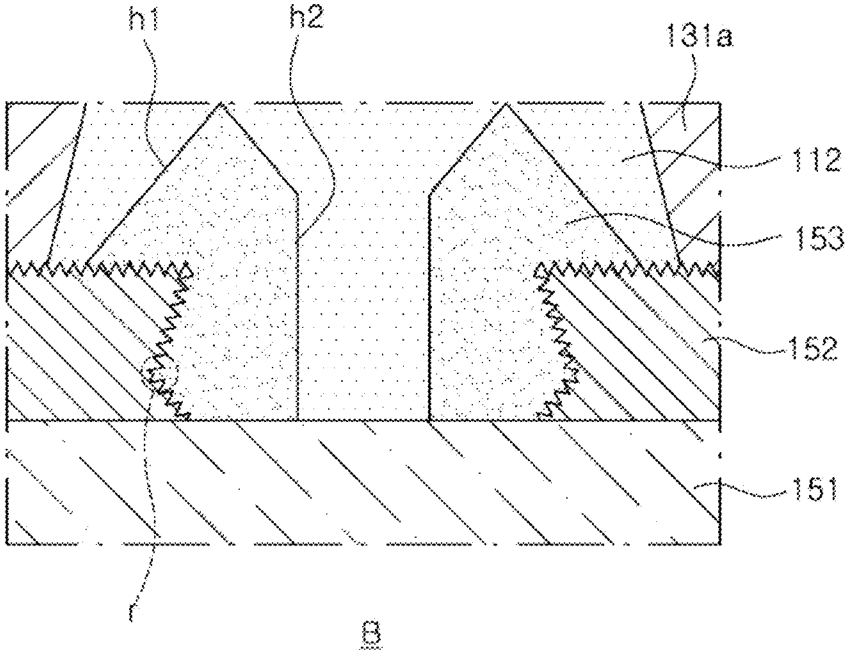

FIGS. 7A to 7C are schematic enlarged cross-sectional views of various examples of region B of the printed circuit board of FIG. 6.

Referring to the drawings, as compared to the printed circuit board 100A, in a printed circuit board 100B according to another example, a side surface of each of two adjacent metal pads 152, among a plurality of metal pads 152, may have a recess portion r recessed toward the inside of each metal pad 152. For example, a separation distance between the recess portions r of the side surfaces of the two adjacent metal pads 152, among the plurality of metal pads 152, may be greater than a separation distance between upper ends of the two metal pads 152 and/or a separation distance between lower ends of the two metal pads 152. In this case, adhesion between the plurality of metal pads 152 and a passivation layer 153 may be further improved through an anchor effect or the like. Accordingly, even when, for example, an IPD, including a plurality of copper pads and a polyimide film protecting the same, is embedded in the electronic component 150, the above-described delamination issue or the like may be more effectively improved. Accordingly, the printed circuit board 100B according to another example and a product including the same may have further improved reliability. The recess portion r may be formed when an electronic component 150 is manufactured, for example, when a single IPD is manufactured.

Even in the printed circuit board 100B according to another example, the passivation layer 153 may cover at least a portion of an upper surface and at least a portion of a side surface of each of the plurality of metal pads 152. For example, as illustrated in FIG. 7A, the passivation layer 153 may cover an edge portion of an upper surface and a side surface of each metal pad 152, between two adjacent metal pads 152, among the plurality of metal pads 152. In this case, roughness may be formed on surfaces of the plurality of metal pads 152, as necessary. For example, as illustrated in FIG. 7B, a portion of an upper surface of each of the plurality of metal pads 152, exposed from the passivation layer 153, may have a surface roughness greater than that of a lower surface of each of the plurality of metal pads 152 in contact with the body 151. For example, as illustrated in FIG. 7C, at least a portion of an upper surface of each of the plurality of metal pads 152 and at least a portion of a side surface of each of the plurality of metal pads 152 including the recess portion r, covered by the passivation layer 153, may also have a surface roughness greater than that of a lower surface of each of the plurality of metal pads 152 in contact with the body 151. In this case, adhesion between the plurality of metal pads 152 and the insulating layer 110 and/or between the plurality of metal pads 152 and/or the passivation layer 153 may be further improved due to an increase in surface areas of the plurality of metal pads 152. Accordingly, even when, for example, an IPD, including a plurality of copper pads and a polyimide film protecting the same, is embedded in the electronic component 150, the above-described delamination issue or the like may be more effectively improved. As a result, the printed circuit board 100B according to another example and a product including the same may have further improved reliability. A surface roughness may be formed when the electronic component 150 is manufactured, for example, when a single IPD is manufactured, but the present disclosure is not limited thereto. For example, the surface roughness illustrated in FIG. 7B may be formed during an embedding process, as described above.

Other contents may be substantially the same as those described in connection with the printed circuit board 100A according to an example, and thus repeated descriptions will be omitted.

Figure 8:
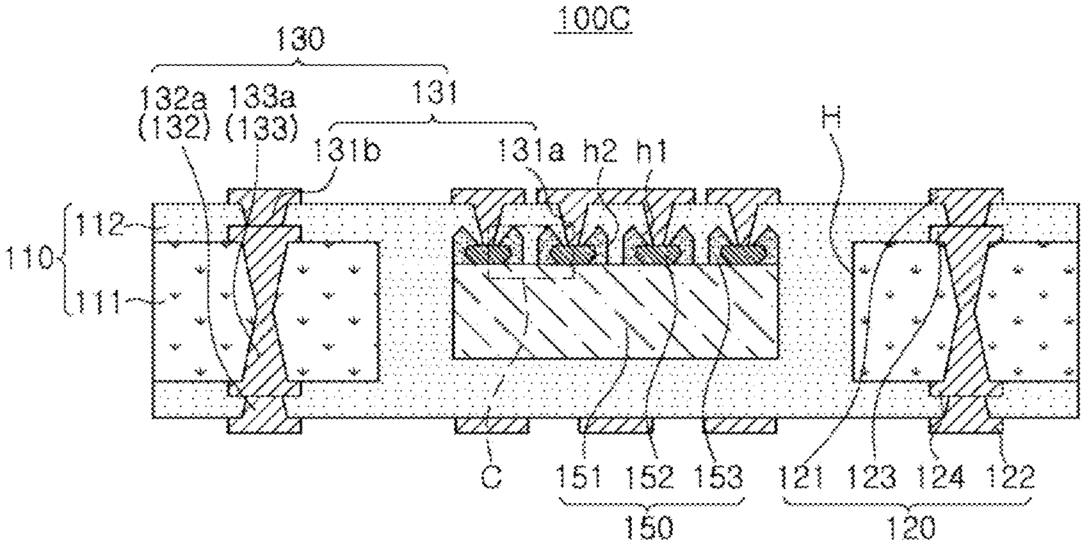
FIG. 8 is a schematic cross-sectional view of a printed circuit board according to another example.

FIG. 8 is a schematic cross-sectional view of a printed circuit board according to another example.

Figure 9A:
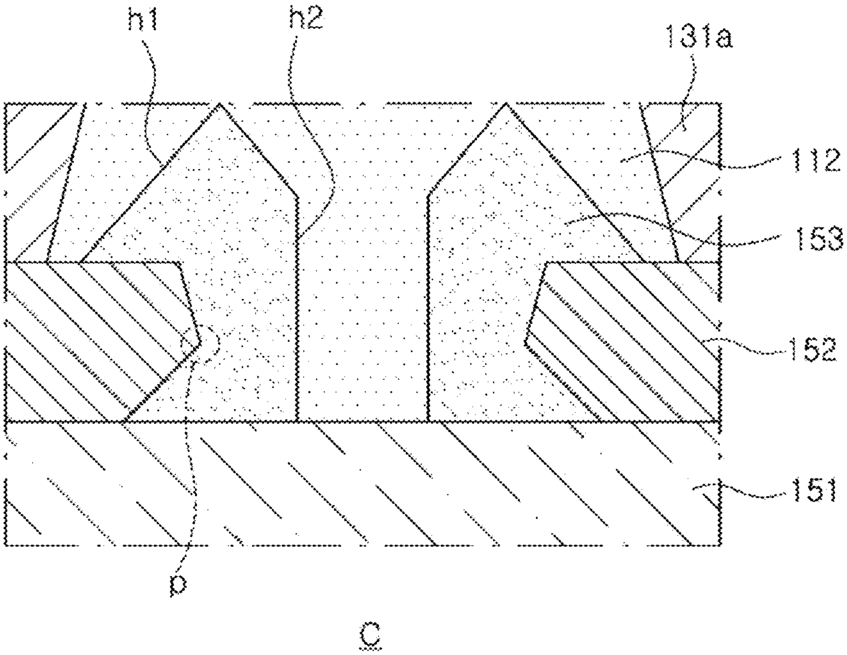
FIGS. 9A to 9C are schematic enlarged cross-sectional views of various examples of region C of the printed circuit board of FIG. 8.
Figure 9B:
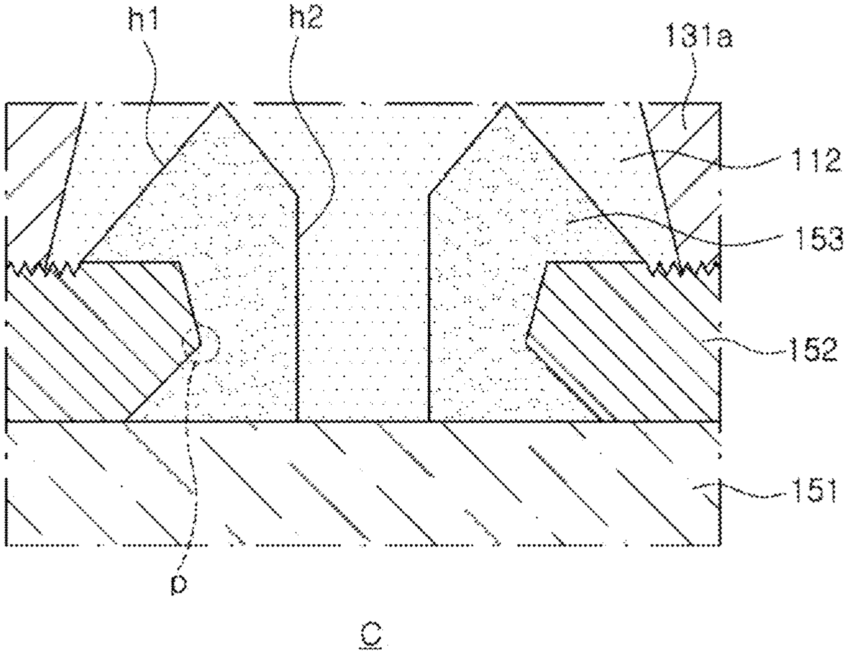
Figure 9C:
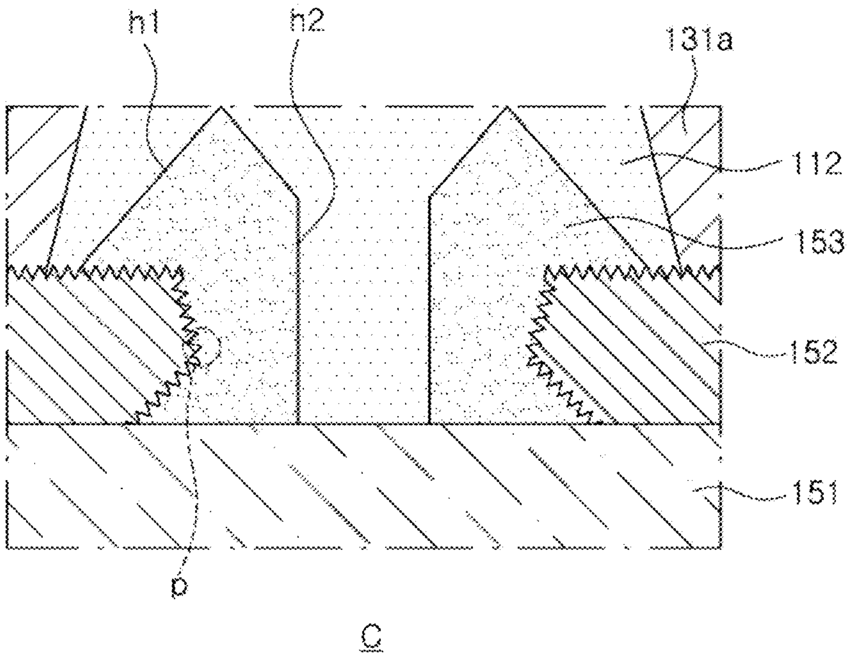

FIGS. 9A to 9C are schematic enlarged cross-sectional views of various examples of region C of the printed circuit board of FIG. 8.

Referring to the drawings, as compared to the printed circuit board 100A, in a printed circuit board 100C according to another example, a side surface of each of two adjacent metal pads 152, among a plurality of metal pads 152, may have a protrusion portion p protruding toward a passivation layer 153. For example, a separation distance between the protrusion portions p of the side surfaces of the two adjacent metal pads 152, among the plurality of metal pads 152, may be greater than a separation distance between upper ends of the two metal pads 152 and/or a separation distance between lower ends of the two metal pads 152. In this case, adhesion between the plurality of metal pads 152 and the passivation layer 153 may be further improved through an anchor effect or the like. Accordingly, even when, for example, an IPD, including a plurality of copper pads and a polyimide film protecting the same, is embedded in an electronic component 150, the above-described delamination issue or the like may be more effectively improved. Accordingly, the printed circuit board 100C according to another example and a product including the same may have further improved reliability. The protrusion portion p may be formed when the electronic component 150 is manufactured, for example, when a single IPD is manufactured.

Even in the printed circuit board 100C according to another example, the passivation layer 153 may cover at least a portion of an upper surface and at least a portion of a side surface of each of the plurality of metal pads 152. For example, as illustrated in FIG. 9A, the passivation layer 153 may cover an edge portion of an upper surface and a side surface of each metal pad 152, between two adjacent metal pads 152, among the plurality of metal pads 152. In this case, roughness may be formed on surfaces of the plurality of metal pads 152, as necessary. For example, as illustrated in FIG. 9B, a portion of an upper surface of each of the plurality of metal pads 152, exposed from the passivation layer 153, may have a surface roughness greater than that of a lower surface of each of the plurality of metal pads 152 in contact with the body 151. For example, as illustrated in FIG. 9C, at least a portion of an upper surface of each of the plurality of metal pads 152 and at least a portion of a side surface of each of the plurality of metal pads 152 including the protrusion portion p, covered by the passivation layer 153, may also have a surface roughness greater than that of a lower surface of each of the plurality of metal pads 152 in contact with the body 151. In this case, adhesion between the plurality of metal pads 152 and the insulating layer 110 and/or between the plurality of metal pads 152 and/or the passivation layer 153 may be further improved due to an increase in surface areas of the plurality of metal pads 152. Accordingly, even when, for example, an IPD, including a plurality of copper pads and a polyimide film protecting the same, is embedded in the electronic component 150, the above-described delamination issue or the like may be more effectively improved. As a result, the printed circuit board 100C according to another example and a product including the same may have further improved reliability. A surface roughness may be formed when the electronic component 150 is manufactured, for example, when a single IPD is manufactured, but the present disclosure is not limited thereto. For example, the surface roughness illustrated in FIG. 9B may be formed during an embedding process, as will be described below.

Other contents may be substantially the same as those described in connection with the printed circuit board 100A according to an example, and thus repeated descriptions will be omitted.

As used herein, the terms "cover," "to cover," and "covering" may include entirely covering as well as at least partially covering, and may include directly covering as well as indirectly covering. In addition, the terms "fill," to fill," and "filling" may include not only entirely filling, but also approximately filling, for example, may include a case in which some voids, pores or the like are present. In addition, the terms "surround," "to surround," and "surrounding" may include not only entirely surrounding but also approximately surrounding. In addition, exposing may include not only entirely exposing but also exposing at least a portion of a structure, and exposure may mean exposing a component from another component in which the component is buried. For example, an exposed component may include another component disposed thereon, in addition to another component. In this case, the meaning of exposure is the same.

As used herein, a process error or a positional deviation occurring in a manufacturing process, an error in measurement, and the like may be included. For example, "substantially perpendicular" may include not only "completely perpendicular," but also "approximately perpendicular." In addition, "substantially coplanar" may include not only "completely coplanar," but also "approximately coplanar."

As used herein, "in cross-section" may refer to a cross-sectional shape of an object when the object is vertically cut, or a cross-sectional shape of the object when the object is viewed in a side-view. In addition, a shape on a plane may be a shape of the object when the object is horizontally cut, or a planar shape of the object when the object is viewed in a top-view or a bottom-view.

As used herein, an upper side, an upper portion, the upper surface, or the like is used to refer to a direction toward a surface on which an electronic component is mountable based on a cross-section of a drawing for ease, and a lower side, a lower portion, a lower surface, or the like is used to refer to an opposite direction thereof. However, the above-described directions are defined for ease of description. Thus, it should be understood that the scope of the claims is not particularly limited by the above-described directions, and the concepts of "upper" and "lower" may change at any time.

As used herein, the term "connected" may not only refer to "directly connected" but also include "indirectly connected" by means of an adhesive layer, or the like. The term "electrically connected" may include both of a case in which components are "physically connected" and a case in which components are "not physically connected." In addition, the terms "first," "second," and the like may be used to distinguish a component from another component, and may not limit a sequence and/or an importance, or others, in relation to the components. In some cases, a first component may be referred to as a second component, and similarly, a second component may be referred to as a first component without departing from the scope of the example embodiments.

As used herein, "passing through" may mean not only entirely passing through a space between upper and lower surfaces of an object in a thickness direction or lamination direction, but also passing through a portion from the upper surface or a portion from the lower surface in a recess or blind form.

As used herein, thickness, width, length, depth, line width, space, pitch, separation distance, surface roughness, and the like may be measured using a scanning microscope or an optical microscope based on a cross-section obtained by polishing or cutting a printed circuit board. The cross-section may be a vertical cross-section or a horizontal cross-section, and each value may be measured based on the required cross-section. For example, a width of an upper end and/or lower end of a via may be measured in cross-section taken along a central axis of the via. When the value is not constant, the value may be determined as an average value of values measured at five arbitrary points.

As used herein, the term "an example embodiment" is provided to emphasize a particular feature, structure, or characteristic, and do not necessarily refer to the same example embodiment. In addition, the particular characteristics or features may be combined in any suitable manner in one or more example embodiments. For example, a context described in a specific example embodiment may be used in other example embodiments, even if it is not described in the other example embodiments, unless it is described contrary to or inconsistent with the context in the other example embodiments.

The terms used herein describe particular example embodiments only, and the present disclosure is not limited thereby. As used herein, singular forms "a," "an," and "the" are intended to include the plural forms as well, unless the context clearly indicates otherwise.

While example embodiments have been shown and described above, it will be apparent to those skilled in the art that modifications and variations could be made without departing from the scope of the present disclosure as defined by the appended claims.

What is claimed is:

1. A printed circuit board comprising:

an electronic component including a body, a plurality of metal pads disposed on the body to be spaced apart from each other, and a passivation layer covering a portion of each of the plurality of metal pads; and an insulating layer covering at least a portion of the electronic component, wherein the passivation layer has a plurality of first openings exposing different portions of each of the plurality of metal pads, and a plurality of second openings spaced apart from the plurality of metal pads, the plurality of second openings respectively passing through at least a portion of the passivation layer, and the insulating layer is disposed in at least a portion of each of the plurality of first and second openings.

2. The printed circuit board of claim 1, wherein the at least portion of the passivation layer, which the plurality of second openings respectively pass through, is between two adjacent metal pads, among the plurality of metal pads.

3. The printed circuit board of claim 2, wherein the plurality of second openings respectively expose a portion of the body.

4. The printed circuit board of claim 1, wherein the passivation layer covers a portion of an upper surface and at least a portion of a side surface of one of the plurality of metal pads.

5. The printed circuit board of claim 4, wherein another portion of the upper surface of the one of the plurality of metal pads, exposed from the passivation layer, has a surface roughness greater than that of a lower surface of each of the plurality of metal pads in contact with the body.

6. The printed circuit board of claim 5, wherein the portion of the upper surface and the at least portion of the side surface of the one of the plurality of metal pads, covered by the passivation layer, have a surface roughness greater than that of the lower surface of the one of the plurality of metal pads in contact with the body.

7. The printed circuit board of claim 4, wherein a side surface of each of two adjacent metal pads, among the plurality of metal pads, has a recess portion recessed toward inside of each of the two adjacent metal pads.

8. The printed circuit board of claim 7, wherein a separation distance between the recess portions on the side surfaces of the two adjacent metal pads, among the plurality of metal pads, is greater than a separation distance between upper ends of the two adjacent metal pads and a separation distance between lower ends of the two adjacent metal pads.

9. The printed circuit board of claim 4, wherein a side surface of each of two adjacent metal pads, among the plurality of metal pads, has a protrusion portion protruding toward the passivation layer.

10. The printed circuit board of claim 9, wherein a separation distance between the protrusion portions on the side surfaces of the two adjacent metal pads, among the plurality of metal pads, is less than a separation distance between upper ends of the two adjacent metal pads and a separation distance between lower ends of the two adjacent metal pads.

11. The printed circuit board of claim 1, further comprising:

a wiring layer disposed on or in the insulating layer; and a via layer disposed in the insulating layer, wherein the via layer includes a plurality of first connection vias respectively passing through at least a portion of the insulating layer, on the plurality of first openings, the plurality of first connection vias respectively connecting each of the plurality of metal pads to at least a portion of the wiring layer.

12. The printed circuit board of claim 11, wherein the insulating layer includes a first insulating layer having a through-portion in which at least a portion of the electronic component is disposed, and a second insulating layer covering at least a portion of each of the first insulating layer and the electronic component, the second insulating layer disposed in at least a portion of the through-portion, the wiring layer includes a first wiring layer disposed on an upper surface of the second insulating layer, a second wiring layer disposed on a lower surface of the second insulating layer, a third wiring layer disposed on an upper surface of the first insulating layer, the third wiring layer at least partially buried in the second insulating layer, and a fourth wiring layer disposed on a lower surface of the first insulating layer, the fourth wiring layer at least partially buried in the second insulating layer, and the via layer includes a first via layer including a plurality of first connection vias respectively passing through a portion of the second insulating layer, the plurality of first connection vias respectively connecting each of the plurality of metal pads to at least a portion of the first wiring layer, and a plurality of second connection vias respectively passing through another portion of the second insulating layer, the plurality of second connection vias respectively connecting at least a portion of the first wiring layer and at least a portion of the third wiring layer to each other, a second via layer including a plurality of third connection vias respectively passing through another portion of the second insulating layer, the plurality of third connection vias connecting at least a portion of the second wiring layer and at least a portion of the fourth wiring layer to each other, and a third via layer including a plurality of through-vias respectively passing through the first insulating layer, the plurality of through-vias respectively connecting at least a portion of the third wiring layer and at least a portion of the fourth wiring layer to each other.

13. The printed circuit board of claim 1, wherein the electronic component includes an integrated passive device (IPD), the plurality of metal pads respectively include copper (Cu), and the passivation layer includes polyimide (PI).

14. A printed circuit board comprising:

an integrated passive device (IPD) including a body, a plurality of copper pads disposed on the body to be spaced apart from each other, and a polyimide film having at least a portion disposed between two adjacent metal pads, among the plurality of copper pads, on the body, the polyimide film covering at least a portion of an upper surface and at least a portion of a side surface of one of the plurality of copper pads; and an Ajinomoto build-up film (ABF) covering at least another portion of the upper surface of the one of the plurality of copper pads and at least a portion of the polyimide film, wherein at least another portion of the upper surface of the one of the plurality of copper pads, covered by the ABF, has a surface roughness greater than that of at least a portion of a lower surface of the one of the plurality of metal pads in contact with the body.

15. The printed circuit board of claim 14, wherein the at least portion of the upper surface and the at least portion of the side surface of the one of the plurality of copper pads, covered by the polyimide film, have a surface roughness greater than that of the at least a portion of the lower surface of the one of the plurality of metal pads in contact with the body.

16. The printed circuit board of claim 14, wherein the at least portion of the side surface of the one of the plurality of copper pads, covered by the polyimide film, has a recess portion recessed toward inside of the one of the plurality of metal pads, or a protrusion portion protruding toward the polyimide film.

17. A printed circuit board comprising:

an electronic component including a body, a metal pad disposed on the body, and a passivation layer covering a portion of the metal pad;

an insulating layer covering at least a portion of the electronic component;

a wiring layer disposed on the insulating layer; and a connection via disposed in the insulating layer to connect the wiring layer and the metal pad to each other, wherein the passivation layer has an opening exposing a portion of an upper surface of the metal pad, the portion of the upper surface of the metal pad, exposed by the passivation layer and being in contact with the insulating layer and the connection via, has a surface roughness greater than that of a portion of a lower surface of the metal pad in contact with the body.

18. The printed circuit board of claim 17, wherein the passivation layer covers another portion of the upper surface and a portion of a side surface of the metal pad.

19. The printed circuit board of claim 18, wherein the another portion of the upper surface of the metal pad, covered by the passivation layer, has a surface roughness greater than that of the portion of the lower surface of the metal pad in contact with the body.

20. The printed circuit board of claim 18, wherein the another portion of the upper surface of the metal pad and the portion of the side surface of the metal pad, covered by the passivation layer, have a surface roughness greater than that of the portion of the lower surface of the metal pad in contact with the body.

21. The printed circuit board of claim 17, wherein the metal pad has inclined side surfaces such that a distance between upper ends of the metal pad is greater than a distance between lower ends of the metal pad.

22. The printed circuit board of claim 17, wherein the metal pad has protrusion portions respectively on inclined side surfaces thereof such that a distance between the protrusion portions is greater than a distance between lower ends of the metal pad and a distance between upper ends of the metal pad.

23. The printed circuit board of claim 17, wherein the metal pad has recess portions respectively on inclined side surfaces thereof such that a distance between the recess portions is less than a distance between lower ends of the metal pad and a distance between upper ends of the metal pad.

24. The printed circuit board of claim 17, wherein the insulating layer includes a first insulating layer having a through-portion in which at least a portion of the electronic component is disposed, and a second insulating layer covering at least a portion of each of the first insulating layer and the electronic component, and the second insulating layer is disposed in at least a portion of the through-portion and in the opening of the passivation layer to be in contact with the metal pad.

25. The printed circuit board of claim 24, wherein the electronic component includes an integrated passive device (IPD), the metal pad includes copper (Cu), the passivation layer includes polyimide (PI), and the second insulating layer includes an Ajinomoto build-up film (ABF).

* * * * *